(12) United States Patent
Daneshpanah et al.

(10) Patent No.: US 11,156,927 B1
(45) Date of Patent: Oct. 26, 2021

(54) SYSTEM AND METHOD FOR SWITCHING BETWEEN AN EUV PELLICLE AND AN OPTICAL PELLICLE

(71) Applicant: KLA-Tencor Corporation, Milpitas, CA (US)

(72) Inventors: Mohammad Mehdi Daneshpanah, Foster City, CA (US); Daniel Andrew Smith, Pleasanton, CA (US)

(73) Assignee: KLA Corporation, Milpitas, CA (US)

( * ) Notice: Subject to any disclaimer, the term of this patent is extended or adjusted under 35 U.S.C. 154(b) by 92 days.

(21) Appl. No.: 15/961,267

(22) Filed: Apr. 24, 2018

(51) Int. Cl.
*G03F 7/20* (2006.01)
*G03F 1/86* (2012.01)
*G03F 1/62* (2012.01)
*G03F 1/22* (2012.01)

(52) U.S. Cl.
CPC ............ *G03F 7/70983* (2013.01); *G03F 1/22* (2013.01); *G03F 1/62* (2013.01); *G03F 1/86* (2013.01); *G03F 7/7065* (2013.01); *G03F 7/70741* (2013.01); *G03F 7/70991* (2013.01)

(58) Field of Classification Search
CPC ... G03F 1/14; G03F 1/142; G03F 1/22; G03F 1/62; G03F 1/66; G03F 1/86; G03F 7/70691; G03F 7/70733; G03F 7/70741; G03F 7/7065; G03F 7/708; G03F 7/70808; G03F 7/70825; G03F 7/70841; G03F 7/7085; G03F 7/70858; G03F 7/70866; G03F 7/70883; G03F 7/70908; G03F 7/70916; G03F 7/70925; G03F 7/70941; G03F 7/7095; G03F 7/70975; G03F 7/70983; G03F 7/70991

USPC ............ 430/5; 355/30, 52–55, 67–71, 72–77
See application file for complete search history.

(56) References Cited

U.S. PATENT DOCUMENTS

| 5,888,327 A | * | 3/1999 | Akagawa | ............... B32B 38/162 156/281 |
| 2007/0035715 A1 | * | 2/2007 | Choi | ....................... G03F 7/707 355/75 |
| 2011/0100393 A1 | * | 5/2011 | Uemura | .................... G03F 1/64 134/1 |

(Continued)

FOREIGN PATENT DOCUMENTS

| JP | 05045866 A | * | 2/1993 |
| NL | 2017912 B1 | | 1/2018 |

(Continued)

OTHER PUBLICATIONS

English translation of JP05-045866, published Feb. 26, 1993. (Year: 1993).*

*Primary Examiner* — Christina A Riddle
(74) *Attorney, Agent, or Firm* — Suiter Swantz pc llo (57) ABSTRACT

A system for switching between an optical pellicle and an EUV pellicle includes one or more inspection tools configured to perform one or more inspection processes on a mask. The system includes one or more extreme ultraviolet (EUV) lithography tools configured to perform one or more lithographic exposures on the mask. The system includes a dual pellicle handler operatively coupled to the one or more inspection tools and the one or more EUV lithography tools, wherein the dual pellicle handler is configured to attach at least one of an optical pellicle or an EUV pellicle to the mask, wherein the dual pellicle handler is configured to detach at least one of the optical pellicle or the EUV pellicle from the mask.

22 Claims, 5 Drawing Sheets

(56) References Cited

U.S. PATENT DOCUMENTS

| | | | | |
|---|---|---|---|---|
| 2018/0314150 A1* | 11/2018 | Brouns | ................. | G03F 1/38 |
| 2018/0329290 A1* | 11/2018 | Jonckheere | ......... | G03F 7/70975 |
| 2019/0137863 A1* | 5/2019 | Sobieraj | ................ | G03F 1/84 |
| 2020/0174376 A1* | 6/2020 | Ahn | ..................... | G03F 1/84 |

FOREIGN PATENT DOCUMENTS

| | | | | |
|---|---|---|---|---|
| NL | 2017914 B1 | 1/2018 | | |
| WO | WO-2016124536 A2 * | 8/2016 | ............... | G03F 1/62 |

\* cited by examiner

SYSTEM AND METHOD FOR SWITCHING BETWEEN AN EUV PELLICLE AND AN OPTICAL PELLICLE

TECHNICAL FIELD

The present disclosure relates generally to semiconductor fabrication processes, and, more particularly, to a system and method for implementing a EUV pellicle on a mask/reticle during lithographic processes and an optical pellicle during mask/reticle processing.

BACKGROUND

Process flows in modern semiconductor device fabrication involve a multitude of fabrication steps performed by a series of semiconductor fabrication tools. For example, a mask/reticle may be written, inspected, and/or verified within a mask shop facility. Then, a mask/reticle may be transferred to an integrated circuit (IC) fabrication facility, where the mask/reticle is used in a lithographic process (e.g., scanner exposure) to print patterns on a semiconductor wafer. One such lithographic process includes extreme ultraviolet (EUV) lithography. EUV adoption for lithography steps in fabrication facilities is an ongoing activity with the goal of reaching high volume manufacturing (HVM) capabilities. One of the major bottlenecks for EUV implementation involves the ability to keep the front side of the mask/reticle used in EUV lithography defect free to avoid repeating defects at the wafer level.

Currently, the existing approach involves the removal of the EUV pellicle via one or more tools to inspect the mask/reticle (unprotected) and then replace the EUV pellicle prior to use in the scanner equipment. This approach has two major disadvantages. First, the mask/reticle is exposed to potential contamination during three operations: pellicle removal, inspection and pellicle replacement. Second, EUV pellicles, which are generally immature and fragile, must protect the mask/reticle during the majority of the life of the reticle (outside of the scanner). Therefore, a system and method curing the shortcomings of the current approach is desired.

SUMMARY

A system for switching between an EUV pellicle and an optical pellicle on a mask/reticle is disclosed in accordance with one or more embodiments for the present disclosure. In one embodiment, the system includes one or more inspection tools configured to perform one or more inspection processes on a mask. In another embodiment, the system includes one or more extreme ultraviolet (EUV) lithography tools configured to perform one or more lithographic exposures on the mask. In another embodiment, the system includes a dual pellicle handler operatively coupled to the one or more inspection tools and the one or more EUV lithography tools, wherein the dual pellicle handler is configured to attach at least one of an optical pellicle or an EUV pellicle to the mask, wherein the dual pellicle handler is configured to detach at least one of the optical pellicle or the EUV pellicle from the mask.

A method for switching between an EUV pellicle and an optical pellicle on a mask/reticle is disclosed in accordance with one or more embodiments for the present disclosure. In one embodiment, the method includes attaching an optical pellicle to a mask. In another embodiment, the method includes performing one or more inspection processes on the mask with the optical pellicle attached to the mask. In another embodiment, the method includes transferring the mask with the optical pellicle attached to the mask to a dual pellicle handler. In another embodiment, the method includes removing, with the dual pellicle handler, the optical pellicle from the mask. In another embodiment, the method includes attaching, with the dual pellicle handler, an extreme ultraviolet (EUV) pellicle to the mask. In another embodiment, the method includes performing one or more lithographic exposures using the mask when the EUV pellicle is attached to the mask. In another embodiment, the method includes removing, with the dual pellicle handler, the EUV pellicle from the mask. In another embodiment, the method includes attaching, with the dual pellicle handler, an additional optical pellicle to the mask.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Referring generally to FIGS. 1A through 3, a system and method for switching between use of an optical pellicle and an EUV pellicle on a mask/reticle during mask processing and/or integrated circuit fabrication is described, in accordance with one or more embodiments of the present disclosure.

Embodiments of the present disclosure involve the creation of a new flow in a mask processing shop and an integrated circuit (IC) fabrication facility that allows EUV pellicles to be used during the lithographic step and allows a DUV transparent pellicle (e.g., 193 nm pellicle) to protect the reticle during all (or at least some) of the other steps. For example, embodiments of the present disclosure allow through-pellicle inspection at an outgoing quality control (OQC) check of the mask processing shop facility and at an incoming quality control (IQC) check of the IC fabrication facility.

Embodiments of the present disclosure are directed to the swapping or switching of an EUV pellicle and a DUV pellicle prior to and after a lithography process. The EUV pellicle may be contained within the lithographic area of the IC fabrication facility. The DUV pellicle may protect the mask/reticle for all other times (or at least some other times) outside of the lithography portion of the flow and allows for EUV mask/reticle inspections steps at OQC/IQC to be performed in a straightforward manner. The risk to the mask/reticle is significantly reduced since pellicle swapping is an operation that involves minutes, while a mask/reticle inspection operation performed without a pellicle involves hours of non-protection. In addition, the highest risk step in non-pellicle inspection involves the unloading and handling of the mask/reticle, which can be eliminated by employing a DUV pellicle.

Figure 1A:
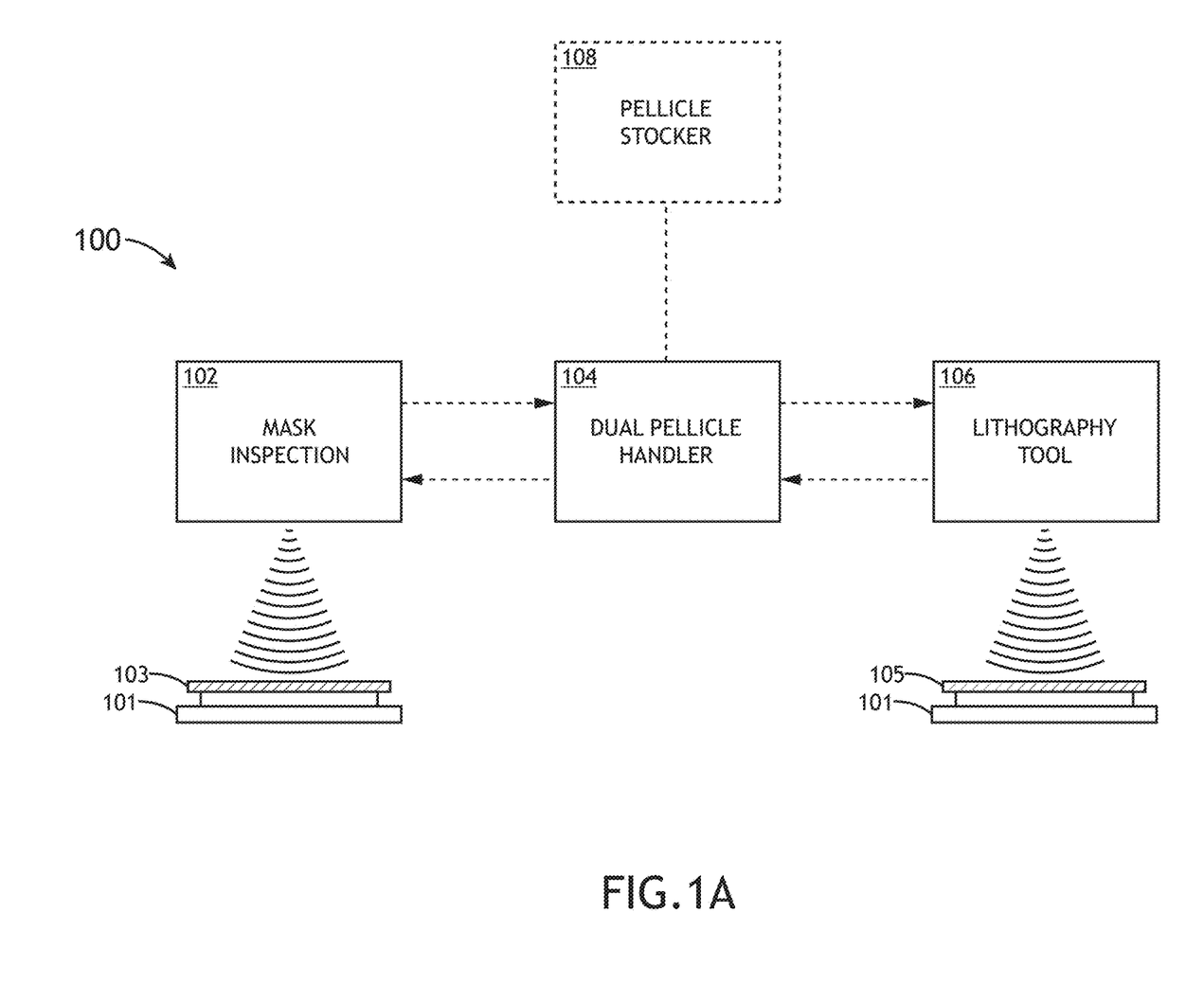
FIG. 1A illustrates a block diagram view of a dual pellicle system for switching between a EUV pellicle and an optical pellicle, in accordance with one or more embodiments of the present disclosure.

FIG. 1A illustrates a block diagram view of a dual pellicle system 100 for switching between a EUV pellicle and an optical pellicle, in accordance with one or more embodiments of the present disclosure. In one embodiment, the system 100 includes one or more mask/reticle inspection tools 102, a dual pellicle handler 104, and one or more lithography tools 106. In one embodiment, the one or more mask/reticle inspection tools 102 may form part of the processing flow of a mask shop or an integrated circuit fabrication facility (e.g., see FIG. 2).

The one or more mask/reticle inspection tools 102 may include any mask/reticle inspection tool known in the art of mask/reticle fabrication and verification. For example, the one or more mask/reticle inspection tools 102 may include, but are not limited to, an optical inspection tool. For instance, the one or more mask/reticle inspection tools 102 may include, but are not limited to, an optical inspection tool. Such an optical inspection tool may include, but is not limited to, a DUV inspection tool (e.g., inspection tool operating at 193 nm). The one or more lithography tools 106 may include any lithography tool known in the art. For example, the one or more lithography tools 106 may include, but are not limited to, one or more EUV lithography tools.

In one embodiment, the inspection tool 102 is configured to perform inspection on a mask/reticle 101 while an optical pellicle 103, which is compatible with the radiation of the inspection tool 102, is attached to the mask/reticle 101. For example, in the case where the inspection tool 102 is an optical inspection tool 102 operating in the DUV range (e.g., 193 nm) of the electromagnetic spectrum, the optical pellicle 103 may include, but is not limited to, an ArF pellicle. By way of another example, the optical pellicle 103 may include, but is not limited to, a KrF pellicle. Such pellicles may be formed from amorphous fluoropolymers such as, but not limited to, polytetrafluoroethylene (e.g., TEFLON AF) or AGC CYTOP. It is noted that the scope of the present disclosure is not limited to an inspection tool operating in the DUV regime, which is provided merely for illustrative purposes. Rather, it is recognized herein that the scope of the present disclosure may be extended to any inspection tool and any portion of the electromagnetic spectrum and may include one or more inspections tools operating in the visible, UV, VUV, DUV, EUV, and/or X-ray portions of the electromagnetic spectrums.

In another embodiment, dual pellicle handler 104 is configured to receive the mask/reticle 101 with the attached optical pellicle 103 prior to the mask/reticle 101 being transferred to the one or more lithography tools 106. In one embodiment, the dual pellicle handler 104 may remove the optical pellicle 103 from the mask/reticle 101 and then attach a EUV pellicle 105 to the mask/reticle in preparation of EUV lithography. In this regard, the dual pellicle handler 104 is compatible with both EUV pellicles and optical pellicles. In one embodiment, the dual pellicle handler 104 is compatible with industry standard EUV pellicles. In another embodiment, optical pellicles 103 used with the dual pellicle handler 104 may be fabricated so as to be compatible with industry standard EUV pellicle swapping stations.

In another embodiment, following attachment of the EUV pellicle 105, the system 100 may transfer the mask/reticle 101 with the attached EUV pellicle 105 to one or more lithography tools 106. In another embodiment, the one or more lithography tools 106 may perform one or more scanning exposures using the mask/reticle 101 with the EUV pellicle attached to the mask/reticle 101 to form one or more patterns on a semiconductor wafer. In another embodiment, following the one or more lithography processes, the system 100 may transfer the mask/reticle 101 back to the dual pellicle handler 104, whereby the dual pellicle handler 104 removes the EUV pellicle 105 and re-attaches an optical pellicle 103 to the mask/reticle 101. This process may be repeated any number of times across any of the various stages of a semiconductor fabrication facility.

In one embodiment, the dual pellicle handler 104 is integrated with a mask inspection tool 102. In this embodiment, the dual pellicle handler 104 and the mask inspection tool 102 are contained within a single integrated tool/device. In another embodiment, the dual pellicle handler 104 is integrated with a lithography tool 106. In this embodiment, the dual pellicle handler 104 and the lithography tool 106 are contained within a single integrated tool/device.

In another embodiment, the dual pellicle handler 104 is a stand-alone device. In this embodiment, the dual pellicle handler 104 is physically removed from the one or more mask inspection tools 102 and/or the one or more lithography tools 106. In this case, the mask/reticle 101 may be transferred from the mask inspection tool 102/lithography tool 106 to/from the dual pellicle handler 104 via a transfer system (e.g., robot).

Figure 1B:
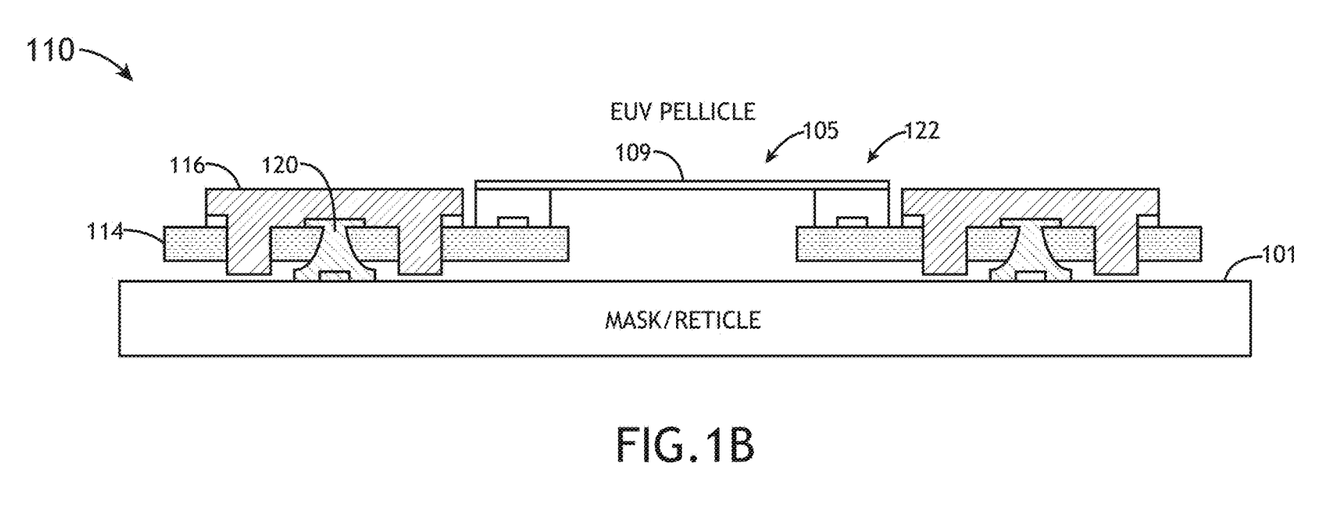
FIG. 1B illustrates a simplified schematic view of a EUV pellicle suitable for using in the dual pellicle system, in accordance with one or more embodiments of the present disclosure.

FIG. 1B depicts a EUV pellicle assembly 110, in accordance with one or more embodiments of the present disclosure. The pellicle assembly 110 includes an EUV pellicle 105 disposed above the mask/reticle 101. In one embodiment, the membrane 109 of the EUV pellicle 105 is suspended above the mask/reticle 101 via a frame 114, fixtures 116, and studs 120, whereby the border 122 of the EUV pellicle 105 supports the membrane across the surface of the mask/reticle 101. In addition, glue interfaces (not shown) may be used to secure the studs 120 to the mask/reticle 101, the frame 114 to the fixtures 116, and the border 122 to the frame 114. Such an EUV pellicle assembly 110 is described in Netherlands (NL) Patent No. 2017912B1, granted on Jan. 11, 2018; and Netherlands (NL) Patent No. 2017914B1, granted on Jan. 11, 2018, which are each incorporated herein by reference in their entirety.

Figure 1C:
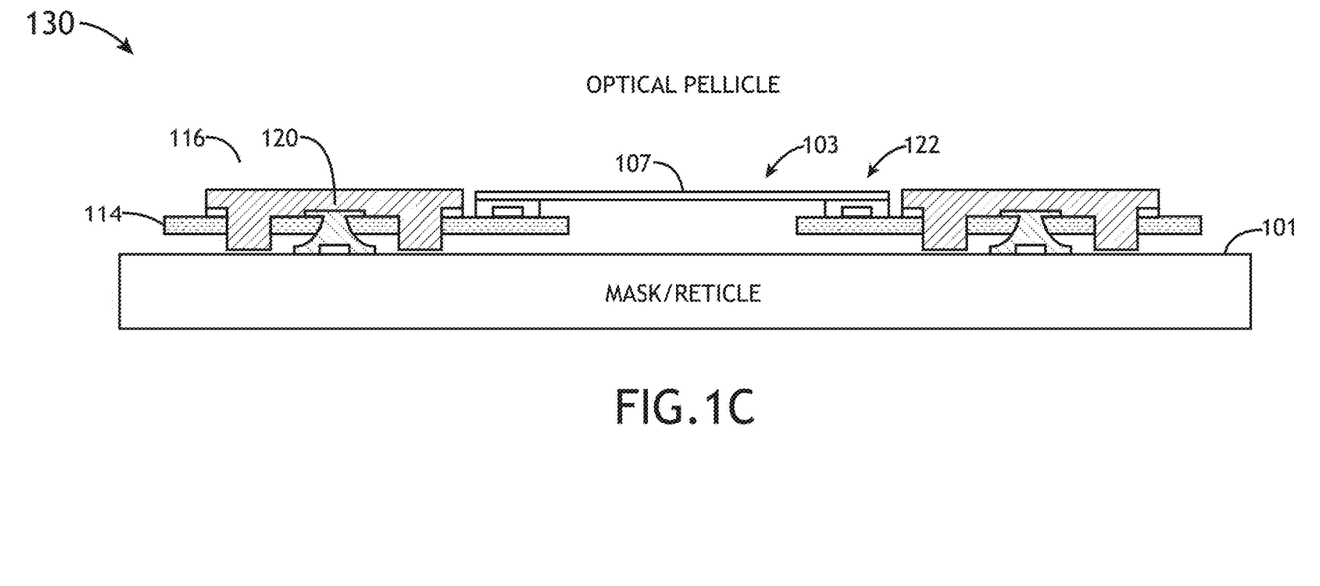
FIG. 1C illustrates a simplified schematic view of an optical pellicle suitable for using in the dual pellicle system, in accordance with one or more embodiments of the present disclosure.

FIG. 1C depicts an optical pellicle assembly 130, in accordance with one or more embodiments of the present disclosure. In one embodiment, the optical pellicle assembly 130 may be fabricated so as to be compatible with the same pellicle swapping stations compatible with the EUV pellicle assembly 110. In one embodiment, the pellicle membrane 107 of the optical pellicle 103 may be formed from a material compatible with DUV radiation, such as, but not limited to, 193 nm radiation. It is again noted that ArF pellicles are generally incompatible with EUV radiation (e.g., 13.5 nm radiation) used in EUV lithography. For example, the membrane 107 may be an ArF pellicle formed from an amorphous fluoropolymer, such as, but not limited to, AGC CYTOP. In another embodiment, the optical pellicle assembly 130 may be fabricated such that the pellicle membrane 107 is significantly closer to the mask/reticle 101 than in the case of the EUV membrane 109. By minimizing the distance between the membrane 107 of the optical pellicle assembly 130 and the surface of the mask/reticle 101 the amount of particles being transported from outside of the pellicle to the mask/reticle surface may be minimized. For example, the membrane 107 of the optical pellicle assembly 130 may be positioned approximately 40-60 µm, such as 50 µm, from the surface of the mask/reticle 101. Such a distance has been found to be mechanically stable over the flatness tolerances of the mask/reticle surface. In contrast, the membrane 109 of the EUV pellicle assembly 110 may be positioned approximately 190-210 µm, such as 200 µm, from the surface of the mask/reticle 101.

Figure 1D:
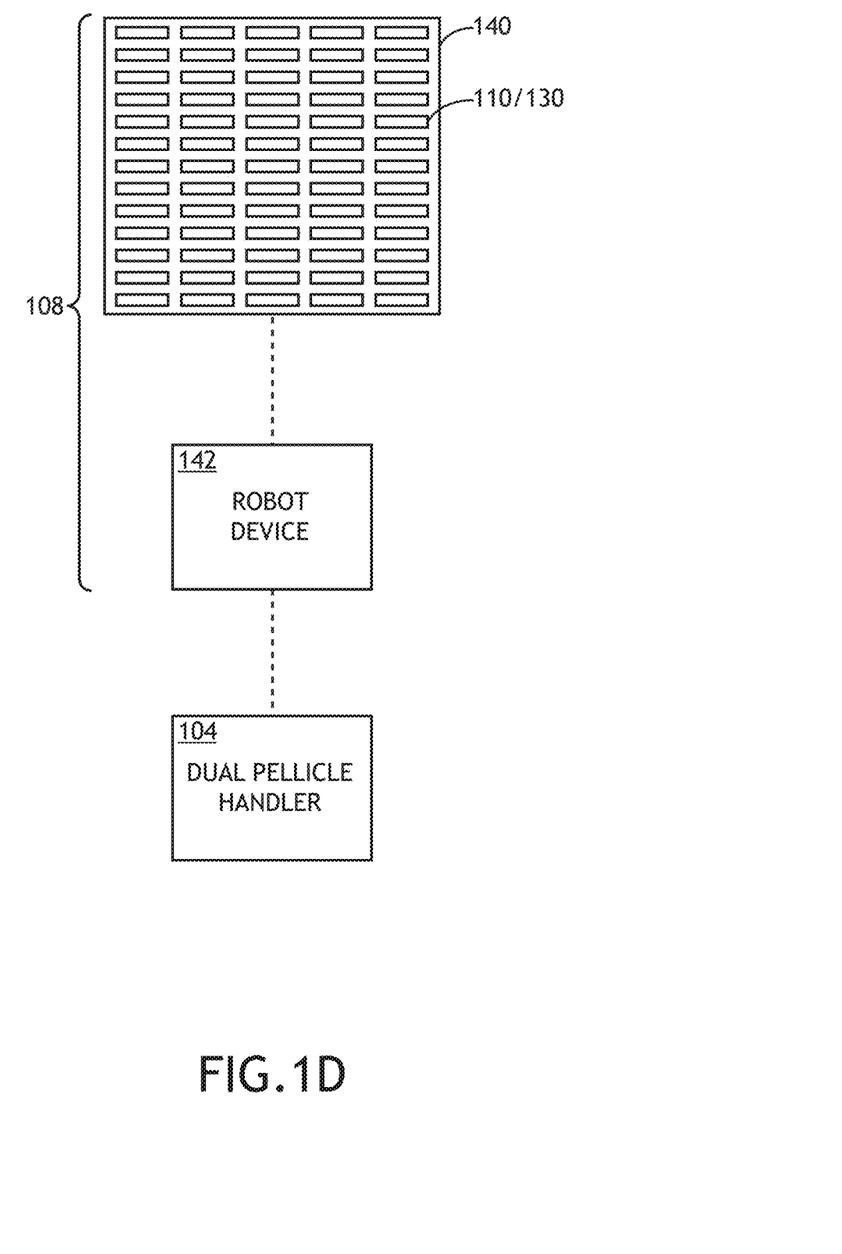
FIG. 1D illustrates a simplified schematic view of a dual pellicle system equipped with a pellicle stocker, in accordance with one or more embodiments of the present disclosure.

Referring again to FIG. 1A, in another embodiment, the system 100 may include a pellicle stocker 108. The pellicle stocker 108 may be operatively coupled to the dual pellicle handler 104 and configured to supply fresh pellicles (e.g., optical pellicles or EUV pellicles) to the dual pellicle handler 104 for attachment to the mask/reticle 101 as it is transferred into and out of the lithographic tool 106. For example, as shown in FIG. 1D, the pellicle stocker 108 may include one or more robotic devices 142 to transfer a pellicle 110/130 from a pellicle storage area 140 (e.g., pellicle locker) to the dual pellicle handler 104. It is noted that the system 100 may be equipped with a single pellicle storage area 140 which accommodates both EUV pellicles 110 and optical pellicles 130. Alternatively, the system 100 may be equipped with multiple pellicle storage areas, whereby a first pellicle storage area is used to store EUV pellicles and a second pellicle storage area is used to store optical pellicles.

Figure 2:
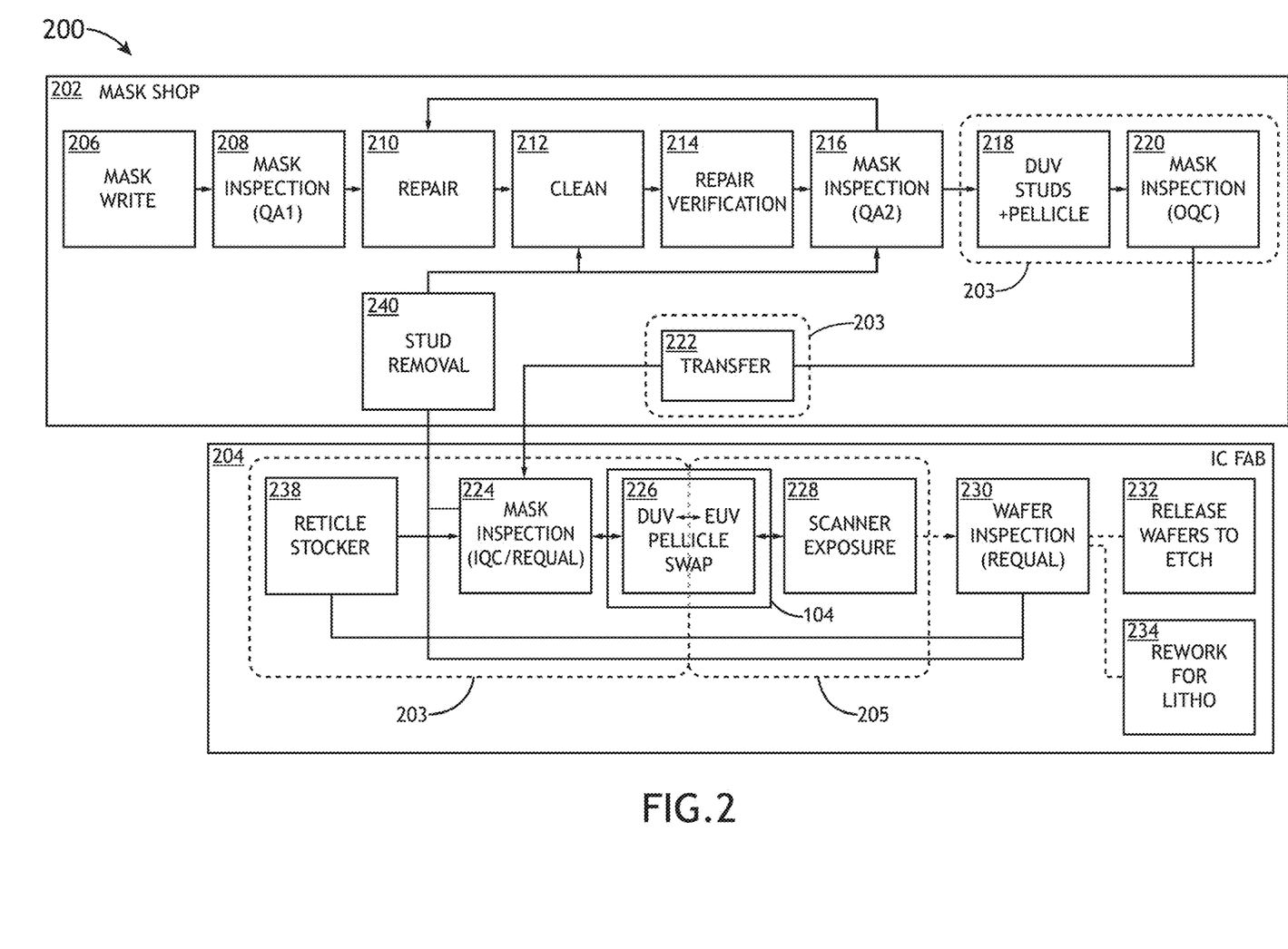
FIG. 2 illustrates a process flow diagram depicting the path of a mask/reticle through a mask shop and an integrated circuit fabrication facility equipped with a dual pellicle handler, in accordance with one or more embodiments of the present disclosure.

In one embodiment, the pellicle stocker 108 is located within a mask shop facility (e.g., mask shop 202). In one embodiment, the pellicle stocker 108 is located within an integrated circuit fabrication facility (e.g., IC fab 204).

In one embodiment, the pellicle stocker 108 is integrated with dual pellicle handler 104. In another embodiment, the pellicle stocker 108 is a stand-alone device, which operates in conjunction with a physically separated dual pellicle handler 104.

In one embodiment, the dual pellicle handler 104 is configured to one or more optical pellicles and/or one or more EUV pellicles. In this regard, the dual pellicle handler 104 may contain storage areas where optical pellicles and/or EUV pellicles can be stored after being demounted from the mask/reticle 101 and/or retrieved prior to their mounting to the mask/reticle 101.

While much of the present disclosure has focused on the implementation of system 100 and the dual pellicle handler 104 in the context of optical inspection, it is noted herein that such a configuration is not a limitation on the scope of the present disclosure. It is noted herein that the scope of the present disclosure may be extended to charged particle beam inspection systems (e.g., electron-beam and focused ion beam), and the like. In one embodiment, the mask inspection system 102 may include an electron beam inspection tool.

In this embodiment, the dual pellicle handler 104 may be integrated with the electron-beam inspection tool. During operation the dual pellicle handler 104 may remove a pellicle (e.g., optical pellicle or EUV pellicle) prior to inspection with the electron-beam inspection tool. Further, the dual pellicle handler 104 may attach the pellicle onto the mask following inspection with the electron-beam tool. It is noted that the dual pellicle handler 104 may stock/handle optical and/or EUV pellicles in the case.

FIG. 2 illustrates a process flow diagram depicting the flow 200 of a mask/reticle through a mask shop 202 and an integrated circuit fabrication facility 204 equipped with a dual pellicle handler 104, in accordance with one or more embodiments of the present disclosure. It is noted that the mask/reticle is protected by an optical pellicle 103 in portions of the flow 200 identified by the dotted regions 203, while the mask/reticle is protected by the EUV pellicle 105 in portions of the flow 200 identified by the dotted region 205.

In one embodiment, the mask shop 202 may include any mask/reticle processing facility known in the art of mask/reticle processing and fabrication. For example, the mask shop 202 may include a mask/reticle processing facility suitable for preparing a mask usable in an EUV lithography tool 106. In step 206, a mask may be written. In step 208, the method 200 may perform an inspection, via an inspection tool, on the mask/reticle. For example, the inspection tool may include, but is not limited to, an optical inspection tool. For instance, the inspection tool may include, but is not limited to, a DUV inspection tool (e.g., inspection tool operating at 193 nm). It is noted that the scope of the present disclosure is not limited to DUV-based inspection or an inspection wavelength of 193 nm. It is recognized that the scope of the present disclosure may extend to any inspection wavelength compatible with the first pellicle type (e.g., ArF pellicle) described previously herein. Following the inspection step 208, the method 200 may perform a repair step 210, a cleaning step 212, and/or a repair verification step 214 on the mask/reticle. In step 216, following repair, cleaning, and/or repair verification of the mask/reticle, the method 200 may perform a second inspection with an inspection tool (e.g., optical inspection tool).

Once the mask/reticle is verified and passes inspection it may be prepared for transfer from the mask shop 202 to the IC fabrication facility 204. In step 218, studs and an optical pellicle are applied to the mask/reticle prior to transfer to the IC fabrication facility 204. Then, in step 220, after the optical pellicle is applied, the method 200 performs an additional inspection of the mask/reticle through the optical pellicle.

Following application of the optical pellicle and the inspection step 220, the mask with the attached optical pellicle is transferred to the IC fabrication facility 204 via a transfer step 222. For example, the mask with the attached optical pellicle may be transferred from the mask shop 202 to the IC fabrication facility 204 via an overhead transfer (OHT) system.

In step 224, following transfer of the mask/reticle from the mask shop 202, the method 200 performs an additional inspection of the mask/reticle to carry out an incoming quality control (IQC) check on the mask/reticle. In step 226, following IQC inspection, the dual pellicle handler 104 may remove the DUV pellicle from the mask/reticle and attach an EUV pellicle. In step 228, one or more lithographic scanner exposures are performed using the mask/reticle to form one or more patterns on a wafer.

In step 230, the wafer is inspected. In the event the wafer passes quality control thresholds, the method moves to step 232 and release the wafer for etching. In the event the wafer does not pass quality control thresholds, the wafer may be lithographically reworked (step 234). In some cases, when the wafer does not pass quality control (step 230), the method transfers the mask/reticle back to the mask shop 202 for additional processing. In this case, the method 200 may move to step 240 and remove the studs (and/or other pellicle-related architecture from the mask/reticle). Then, the method may move back to step 216 for an additional inspection of the mask/reticle to determine if the mask should be repaired (step 210) or re-pelliclized (step 218). In other cases, when the wafer does pass quality control (step 230), the method 200 transfers the mask/reticle back to the dual pellicle handler 104, which removes the EUV pellicle and attaches a new optical pellicle. Then, in step 238, the mask/reticle equipped with an optical pellicle may be moved to a reticle stocker, where the mask/reticle can be held until needed again for lithography at which point the method 200 repeats steps 224, 226, 228, 230, 232/234, and 240.

Figure 3:
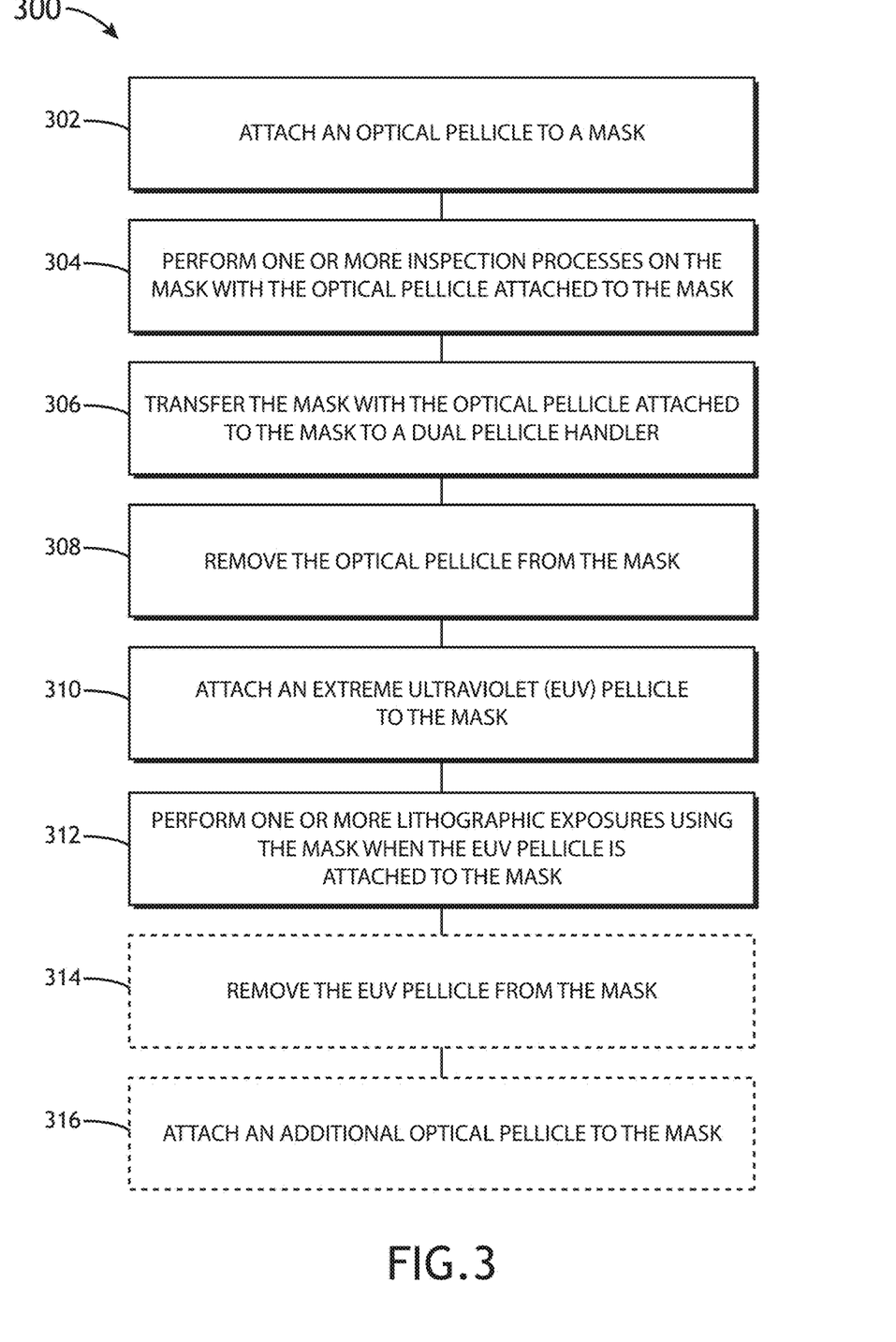
FIG. 3 illustrates a process flow diagram depicting a method for switching between a EUV pellicle and an optical pellicle, in accordance with one or more embodiments of the present disclosure.

FIG. 3 illustrates a process flow diagram depicting a method 300 for switching between a EUV pellicle and an optical pellicle, in accordance with one or more embodiments of the present disclosure.

In step 302, an optical pellicle is attached to a mask/reticle. For example, an optical pellicle transparent to DUV radiation (e.g., approximately 193 nm radiation) is attached to the mask/reticle. For instance, the optical pellicle may include, but is not limited to, an ArF pellicle. In step 304, one or more inspection processes are performed on the mask equipped with the optical pellicle attached to the mask. For example, one or more DUV inspection processes may be performed on the mask/reticle, whereby the DUV radiation is transmitted (at least partially) through the DUV transparent pellicle. In step 306, the mask/reticle equipped with the optical pellicle is transferred to a dual pellicle handler 104. For example, the dual pellicle handler 104 may be capable of attaching/removing optical pellicles and EUV pellicles. In step 308, the optical pellicle is removed from the mask/reticle. For example, the optical pellicle may be removed from the mask/reticle using the dual pellicle handler 104. In step 310, an EUV pellicle is attached to the mask/reticle. For example, the EUV pellicle may be attached to the mask/reticle using the dual pellicle handler. In step 312, one or more lithographic exposures are performed on a wafer using the mask/reticle when the EUV pellicle is attached to the mask/reticle. For example, a lithographic scanner may be implemented to expose the mask/reticle to EUV radiation (e.g., 13.5 nm radiation), whereby the EUV radiation is transmitted through the EUV pellicle. In step 314, the EUV pellicle is removed from the mask/reticle. For example, the EUV pellicle may be removed from the mask/reticle using the dual pellicle handler 104. In step 316, an optical pellicle is attached to the mask/reticle. For example, the optical pellicle may be attached to the mask/reticle using the dual pellicle handler 104.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the disclosure is defined by the appended claims.

What is claimed is:

1. A system comprising:
    one or more inspection tools configured to perform one or more inspection processes on a mask;
    one or more extreme ultraviolet (EUV) lithography tools configured to perform one or more lithographic exposures on the mask;
    a dual pellicle handler operatively coupled to the one or more inspection tools and the one or more EUV lithography tools, wherein the dual pellicle handler is configured to attach at least one of an optical pellicle or an EUV pellicle to the mask, wherein the dual pellicle handler is configured to detach at least one of the optical pellicle or the EUV pellicle from the mask; and
    a pellicle stocker, wherein the pellicle stocker is configured to supply EUV pellicles and optical pellicles to the dual pellicle handler, wherein the pellicle stocker includes a plurality of pellicle storage areas, wherein a first pellicle storage area is configured to store the EUV pellicles and a second pellicle storage area is configured to store the optical pellicles, wherein the pellicle stocker includes one or more robotic devices configured to transfer the EUV pellicles and the optical pellicles from the plurality of pellicle storage areas.

2. The system of claim 1, wherein the dual pellicle handler is integrated with at least one of the one or more inspection tools or the one or more EUV lithography tools.

3. The system of claim 1, wherein the one or more inspection tools comprise:
    at least one of a visible inspection tool, an ultraviolet inspection tool, a vacuum ultraviolet inspection tool, or a deep ultraviolet inspection tool.

4. The system of claim 3, wherein the one or more inspection tools comprise:
    a deep ultraviolet inspection tool configured to illuminate the mask with radiation having a wavelength of approximately 193 nm.

5. The system of claim 1, wherein the one or more inspection tools comprise a portion of a mask shop facility.

6. The system of claim 1, wherein the one or more inspection tools comprise a portion of an integrated circuit fabrication facility.

7. The system of claim 1, wherein the dual pellicle handler is configured to store at least one of one or more optical pellicles or one or more EUV pellicles.

8. The system of claim 1, wherein the pellicle stocker is integrated with the dual pellicle handler.

9. The system of claim 1, wherein the pellicle stocker is located within an integrated circuit fabrication facility.

10. The system of claim 1, wherein the pellicle stocker is located within a mask shop facility.

11. The system of claim 1, wherein the optical pellicle comprises:
    a DUV pellicle.

12. The system of claim 11, wherein the DUV pellicle comprises:
    an ArF pellicle.

13. The system of claim 1, wherein the one or more inspection tools comprise:
    an electron-beam inspection tool.

14. The system of claim 13, wherein the dual pellicle handler is integrated with the electron-beam inspection tool, wherein the dual pellicle handler is configured to remove at least one of the optical pellicle or the EUV pellicle prior to inspection with the one or more electron-beam inspection tool, wherein the dual pellicle handler is further configured to attach at least one of the optical pellicle or the EUV pellicle following inspection with the one or more inspection tools.

15. A method comprising:
    attaching an optical pellicle to a mask;
    performing one or more inspection processes on the mask with the optical pellicle attached to the mask;
    transferring the mask with the optical pellicle attached to the mask to a dual pellicle handler;
    removing, with the dual pellicle handler, the optical pellicle from the mask;
    attaching, with the dual pellicle handler, an extreme ultraviolet (EUV) pellicle to the mask;
    performing one or more lithographic exposures using the mask when the EUV pellicle is attached to the mask;
    removing, with the dual pellicle handler, the EUV pellicle from the mask;
    attaching, with the dual pellicle handler, an additional optical pellicle to the mask; and
    supplying, with a pellicle stocker, EUV pellicles and optical pellicles to the dual pellicle handler, wherein the pellicle stocker includes a plurality of pellicle storage areas, wherein a first pellicle storage area is configured to store the EUV pellicles and a second pellicle storage area is configured to store the optical pellicles, wherein the pellicle stocker includes one or more robotic devices configured to transfer the EUV pellicles and the optical pellicles from the plurality of storage areas.

16. The method of claim 15, wherein the attaching the optical pellicle to a mask comprises:
    attaching a deep ultraviolet pellicle to the mask.

17. The method of claim 15, wherein the attaching the optical pellicle to a mask comprises:
    attaching an ArF pellicle to the mask.

18. The method of claim 15, wherein the performing one or more inspection processes on the mask with the optical pellicle attached to the mask comprises:
    performing at least one of one or more visible inspection processes, one or more UV inspection processes, one or more VUV inspection processes, or one or more DUV inspection processes on the mask with the optical pellicle attached to the mask.

19. The method of claim 18, wherein the performing at least one of one or more visible inspection processes, one or more UV inspection processes, one or more VUV inspection processes, or one or more DUV inspection processes on the mask with the optical pellicle attached to the mask comprises:
    performing one or more DUV inspection processes on the mask at approximately 193 nm.

20. The method of claim 15, wherein the one or more inspection processes are performed within a mask shop facility.

21. The method of claim 15, wherein the one or more inspection process are performed within an integrated circuit fabrication facility.

22. The method of claim 15, wherein the supplying, with the pellicle stocker, the EUV pellicles and the optical pellicles to the dual pellicle handler comprises:
 supplying, with the pellicle stocker located in an integrated circuit fabrication facility, the EUV pellicles and the optical pellicles to the dual pellicle handler.

* * * * *